United States Patent
Kojima et al.

(10) Patent No.: US 11,855,594 B2
(45) Date of Patent: *Dec. 26, 2023

(54) RADIO FREQUENCY CIRCUIT AND COMMUNICATION DEVICE

(71) Applicant: Murata Manufacturing Co., Ltd., Kyoto (JP)

(72) Inventors: Hiroshi Kojima, Nagaokakyo (JP); Reiji Nakajima, Nagaokakyo (JP); Hirotsugu Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 26 days.

This patent is subject to a terminal disclaimer.

(21) Appl. No.: 17/153,299

(22) Filed: Jan. 20, 2021

(65) Prior Publication Data
US 2021/0234521 A1 Jul. 29, 2021

(30) Foreign Application Priority Data

Jan. 24, 2020 (JP) .................................. 2020-010256

(51) Int. Cl.
*H03F 3/24* (2006.01)
*H03F 3/21* (2006.01)
*H03F 3/19* (2006.01)
*H04W 52/00* (2009.01)

(52) U.S. Cl.
CPC ............. *H03F 3/245* (2013.01); *H03F 3/19* (2013.01); *H03F 3/211* (2013.01); *H04W 52/00* (2013.01); *H03F 2200/451* (2013.01)

(58) Field of Classification Search
None
See application file for complete search history.

(56) References Cited

U.S. PATENT DOCUMENTS

| 11,469,712 | B2 * | 10/2022 | Sano ..................... H03F 1/0211 |
| 2019/0261284 | A1 | 8/2019 | Moroga et al. |
| 2020/0412307 | A1 * | 12/2020 | Hitomi ................. H03F 1/0222 |
| 2021/0258028 | A1 * | 8/2021 | Tanaka ................ H04B 1/0483 |

FOREIGN PATENT DOCUMENTS

| EP | 3070842 A1 * | 9/2016 | ........... H03F 1/0255 |
| JP | 2011-030257 A | 2/2011 | |
| WO | 2018/083862 A1 | 5/2018 | |

OTHER PUBLICATIONS

3rd Generation Partnership Project, 3GPP TS 38.101-1, Technical Specification, User Equipment (UE) radio transmission and reception, Jun. 2020, pp. 1-239, V15.10.0, 3GPP, Valbonne, France.

* cited by examiner

*Primary Examiner* — Daniel C Puentes
(74) *Attorney, Agent, or Firm* — Pearne & Gordon LLP

(57) ABSTRACT

A radio frequency circuit includes: an amplifier circuit configured to amplify a first radio frequency signal using a first power supply voltage, and amplify a second radio frequency signal using a second power supply voltage. The first radio frequency signal is a signal in a first band for Long Term Evolution (LTE), the second radio frequency signal is a signal in a second band for 5th Generation New Radio (5G NR) or a wireless local area network (WLAN) signal, and in a state in which a first predetermined condition regarding the first radio frequency signal and the second radio frequency signal is satisfied, a value of the second power supply voltage is greater than a value of the first power supply voltage.

11 Claims, 10 Drawing Sheets

RADIO FREQUENCY CIRCUIT AND COMMUNICATION DEVICE

CROSS REFERENCE TO RELATED APPLICATION

The present application is based on and claims priority of Japanese Patent Application No. 2020-010256 filed on Jan. 24, 2020. The entire disclosure of the above-identified application, including the specification, drawings and claims is incorporated herein by reference in its entirety.

TECHNICAL FIELD

The present disclosure relates to radio frequency (RF) circuits and communication devices that include the radio frequency circuit.

BACKGROUND

International Patent Application Publication No. 2018/083862 and Japanese Unexamined Patent Application Publication No. 2011-30257 disclose that in a communication system that can transmit radio frequency signals for which different modulation methods are used, a quality requirement for radio frequency signals is satisfied by controlling a transmission power level while a performance requirement of an amplifier is maintained less strict.

BRIEF SUMMARY

However, as recognized by the present inventor, according to the above conventional technology, a transmission power level is limited in order to satisfy the quality requirement for radio frequency signals, and thus the quality requirement cannot be satisfied under the environment where a transmission power level cannot be limited.

In view of this, the present disclosure provides radio frequency circuits and communication devices that can make the limit of the transmission power level less strict in communication systems that can transmit radio frequency signals for which different modulation methods are used.

A radio frequency circuit according to an aspect of the present disclosure includes: an amplifier circuit configured to amplify a first radio frequency signal using a first power supply voltage, and amplify a second radio frequency signal using a second power supply voltage. The first radio frequency signal is a signal in a first band for Long Term Evolution (LTE), the second radio frequency signal is a signal in a second band for 5th Generation New Radio (5G NR) or a wireless local area network (WLAN) signal, and in a state in which a first predetermined condition regarding the first radio frequency signal and the second radio frequency signal is satisfied, a value of the second power supply voltage is greater than a value of the first power supply voltage.

According to the present disclosure, the limit of a transmission power level can be made less strict in a communication system that can transmit radio frequency signals for which different modulation methods are used.

BRIEF DESCRIPTION OF DRAWINGS

These and other advantages and features will become apparent from the following description thereof taken in conjunction with the accompanying Drawings, by way of non-limiting examples of embodiments disclosed herein.

DETAILED DESCRIPTION OF EMBODIMENTS

Figure 1:
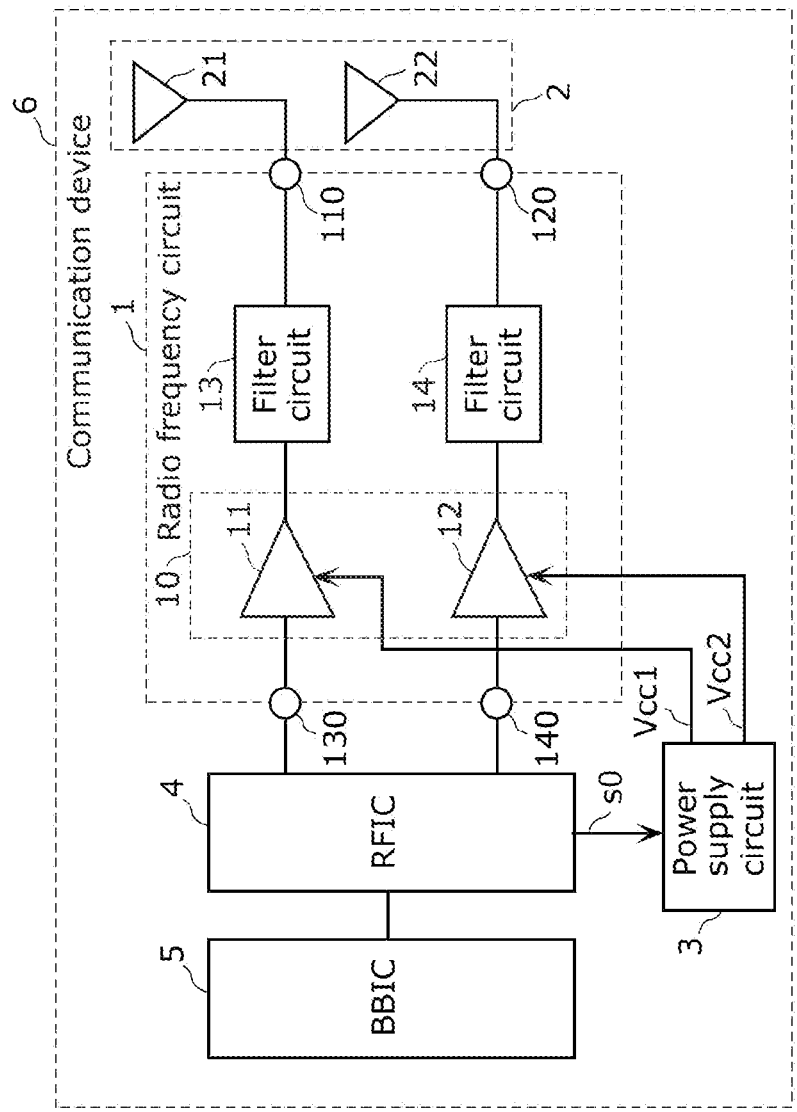
FIG. 1 illustrates a circuit configuration of a radio frequency circuit and a communication device according to Embodiment 1.

The following describes in detail embodiments of the present disclosure, and examples and variations thereof with reference to the drawings. Note that the embodiments, and the examples and variations thereof described below each show a general or specific example. The numerical values, shapes, materials, elements, and the arrangement and connection of the elements, for instance, described in the embodiments, and the examples and variations thereof below are mere examples, and thus are not intended to limit the present disclosure.

Note that the drawings are each a schematic diagram to which emphasis is added as appropriate, from which one or more features are omitted as appropriate, and/or in which ratios are adjusted as appropriate, in order to illustrate the present disclosure, and thus do not give strictly accurate illustration so that a shape, a positional relationship, and a ratio therein may be different from the actual shape, positional relationship, and ratio. In the drawings, the same numeral is given to substantially the same element throughout the drawings, and a redundant description is omitted or simplified.

In the present disclosure, "being connected" means not only the case where elements are directly connected by a connection terminal and/or a line conductor, but also the case where elements are electrically connected via one or more other circuit elements. Furthermore, "being directly connected" means elements are directly connected by a connection terminal and/or a line conductor, without having another circuit element provided therebetween. In addition, "being connected between A and B" means an element is connected to A and B on a path that connects A and B.

Embodiment 1

1.1 Circuit Configuration of Radio Frequency Circuit 1 and Communication Device 6

A circuit configuration of radio frequency circuit 1 and communication device 6 according to the present embodiment is to be described with reference to FIG. 1. FIG. 1 illustrates a circuit configuration of radio frequency circuit 1 and communication device 6 according to Embodiment 1.

1.1.1 Circuit Configuration of Communication Device 6

As illustrated in FIG. 1, communication device 6 according to the present embodiment includes radio frequency circuit 1, antenna circuit 2, power supply circuit 3, RFIC 4, and BBIC 5.

Radio frequency circuit 1 is an example of a radio frequency circuit that transfers radio frequency signals processed in a signal processing circuit. Radio frequency circuit 1 transfers radio frequency signals between antenna circuit 2 and RFIC 4.

Specifically, radio frequency circuit 1 constitutes a transmission circuit that transmits a first radio frequency signal and a second radio frequency signal. A detailed circuit configuration of radio frequency circuit 1 is to be described below.

Antenna circuit 2 includes antennas 21 and 22. Antenna 21 is connected to output terminal 110 of radio frequency circuit 1, and transmits the first radio frequency signal. Antenna 22 is connected to output terminal 120 of radio frequency circuit 1, and transmits the second radio frequency signal.

Power supply circuit 3 applies a power supply voltage to amplifier circuit 10. Specifically, power supply circuit 3 applies first power supply voltage Vcc1 to power amplifier 11, and applies second power supply voltage Vcc2 different from first power supply voltage Vcc1 to power amplifier 12, based on control signal s0 from RFIC 4.

RFIC 4 is an example of a signal processing circuit that processes radio frequency signals. Specifically, RFIC 4 processes a transmission signal input from BBIC 5 by up-conversion, for instance, and outputs a radio frequency transmission signal generated by being processed to one of transmission signal paths of radio frequency circuit 1.

BBIC 5 is a baseband signal processing circuit that processes signals using an intermediate frequency band lower than the frequency band of a radio frequency signal that radio frequency circuit 1 transfers. A signal processed by BBIC 5 is, for example, an image signal for image display and/or as an audio signal for talk through a loudspeaker is used.

RFIC 4 controls a switch, for instance, included in radio frequency circuit 1, based on a communication band used. RFIC 4 outputs, to radio frequency circuit 1, a control signal for adjusting power supply voltages applied to power amplifiers 11 and 12 of radio frequency circuit 1, for instance.

Note that antenna circuit 2, power supply circuit 3, and BBIC 5 are not necessarily included in communication device 6 according to the present embodiment.

1.1.2 Circuit Configuration of Radio Frequency Circuit

As illustrated in FIG. 1, radio frequency circuit 1 includes amplifier circuit 10, filter circuits 13 and 14, input terminals 130 and 140, and output terminals 110 and 120.

Amplifier circuit 10 is an example of an amplifier circuit that amplifies the first radio frequency signal using the first power supply voltage, and amplifies the second radio frequency signal using the second power supply voltage. As illustrated in FIG. 1, amplifier circuit 10 includes power amplifiers 11 and 12.

Power amplifier 11 is an example of a first amplifier. Power amplifier 11 receives the input of the first radio frequency signal, and the supply of first power supply voltage Vcc1. Specifically, power amplifier 11 is connected between input terminal 130 and filter circuit 13, and amplifies the first radio frequency signal input through input terminal 130 using first power supply voltage Vcc1. Thereafter, power amplifier 11 outputs the amplified first radio frequency signal toward output terminal 110 via filter circuit 13.

As the first radio frequency signal, a signal in the first band for LTE (that may be hereafter simply referred to as an LTE signal) is used. An LTE signal is a signal transmitted in accordance with LTE that is a standard for a mobile communication system developed by the 3rd Generation Partnership Project (3GPP). Single-carrier frequency-division multiplexing (SC-FDM) is used as the secondary modulation method (uplink) for an LTE signal. Note that the term "SC-FDM" may mean single-carrier frequency-division multiple access (SC-FDMA) that is multiple access to which SC-FDM is applied. In the following, SC-FDMA is used instead of SC-FDM.

Power amplifier 12 is an example of a second amplifier. Power amplifier 12 receives the input of the second radio frequency signal, and the supply of second power supply voltage Vcc2. Specifically, power amplifier 12 is connected between input terminal 140 and filter circuit 14, and amplifies the second radio frequency signal input through input terminal 140 using second power supply voltage Vcc2. Thereafter, power amplifier 12 outputs the amplified second radio frequency signal toward output terminal 120 via filter circuit 14.

As the second radio frequency signal, a signal in a second band for 5G NR (which may be hereafter simply referred to as a 5G NR signal) and/or a wireless local area network (WLAN) signal is used. A 5G NR signal is a signal transmitted in accordance with NR which is a standard for the 5th generation mobile communication system developed by 3GPP. Discrete Fourier transform spread orthogonal frequency-division multiplexing (DFT-s-OFDM) or cyclic prefix orthogonal frequency-division multiplexing (CP-OFDM) is used as the secondary modulation method for 5G NR signals. A WLAN signal is a signal transmitted in accordance with the Institute of Electrical and Electronics Engineers (IEEE) 802.11 standard. Orthogonal frequency-division multiplexing (OFDM) is used as the secondary modulation method for a WLAN signal. Note that DFT-s-OFDM, CP-OFDM, and OFDM may mean orthogonal frequency-division multiple access (OFDMA) that is multiple access to which DFT-s-OFDM, CP-OFDM, and OFDM are applied, respectively.

Here, when a first predetermined condition regarding the first radio frequency signal and the second radio frequency signal is satisfied, the value of second power supply voltage Vcc2 applied to power amplifier 12 is greater than the value of first power supply voltage Vcc1 applied to power amplifier 11. Note that the values of the power supply voltages may be adjusted based on a transmission power level, a channel bandwidth, a power mode, an amplification mode, or a combination of any of these. Accordingly, the value of first power supply voltage Vcc1 and the value of second power supply voltage Vcc2 are preferably compared at the same transmission power level (for example, Power Class 3 (23 dBm)), with the same channel bandwidth (for example, 10 MHz or 20 MHz), in the same power mode (such as, for example, a high power mode (for example: +23 dBm) or a low power mode (for example: +14 dBm)), and/or in the same amplification mode (for example, an envelope tracking (ET) mode or an average power tracking (APT) mode).

In the present embodiment, amplifier circuit 10 has an ET mode in which a power supply voltage is adjusted by envelope tracking. Note that amplifier circuit 10 may have an APT mode in which a power supply voltage is adjusted by average power tracking, instead of the ET mode. Amplifier circuit 10 may have or may not have both the ET mode and the APT mode.

Figure 2:
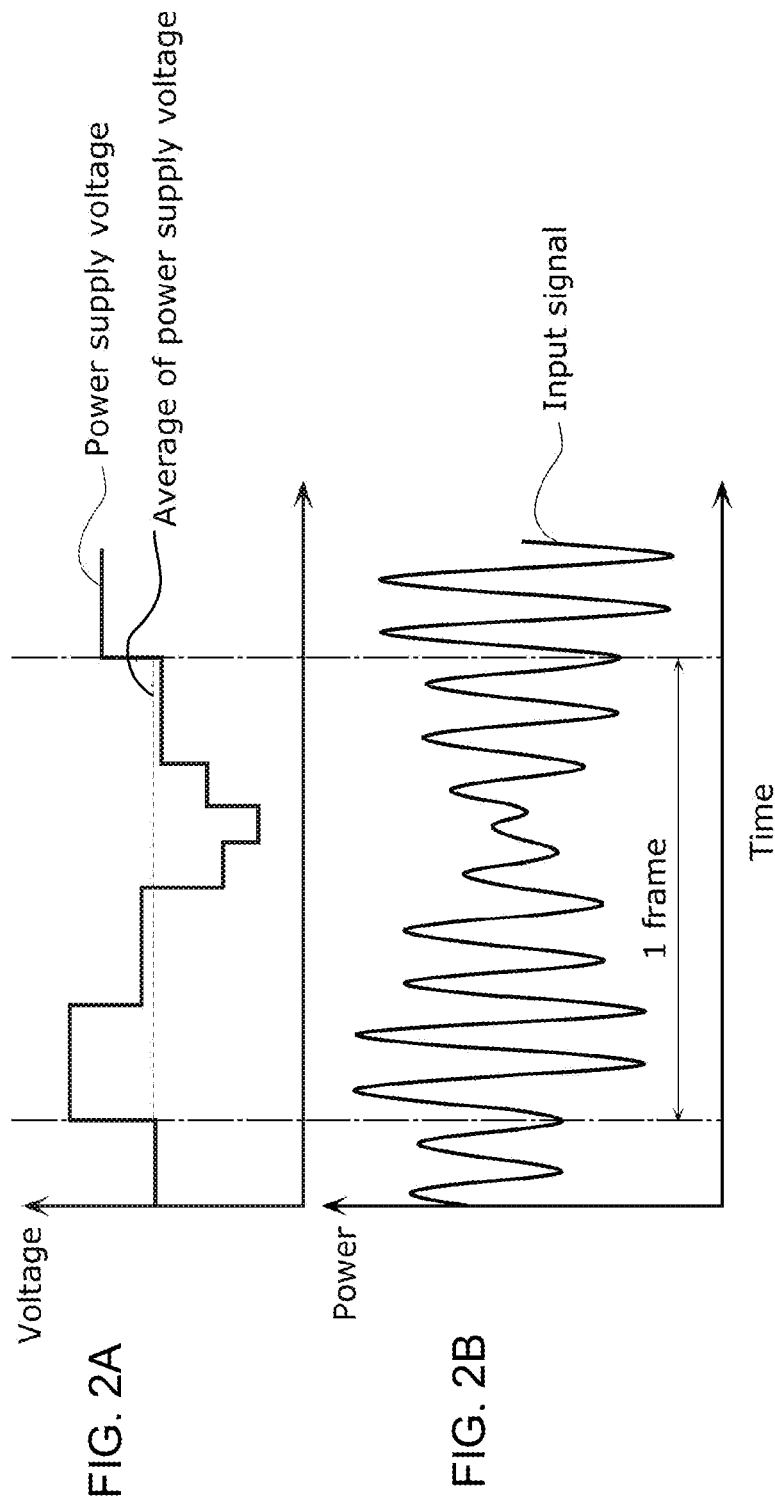
FIGS. 2A and 2B illustrate graphs showing an example of a relation between the input signal and the power supply voltage in an envelope tracking (ET) mode.

FIGS. 2A and 2B illustrate graphs showing an example of a relation between the input signal and the power supply voltage in the ET mode. In FIG. 2A, the horizontal axis represents time (t), and the vertical axis represents a voltage. In FIG. 2B, the horizontal axis represents time (t), and the vertical axis represents a power.

As illustrated in FIGS. 2A and 2B, in the ET mode, the magnitude of the power supply voltage changes with time according to the waveform of an input signal, and thus a time average of the power supply voltage over a predetermined period may be used as the value of a power supply voltage for comparison. Thus, in the ET mode, a time average of first power supply voltage Vcc1 may be used as a value of first power supply voltage Vcc1, and a time average of second power supply voltage Vcc2 may be used as a value of second power supply voltage Vcc2.

Note that other descriptive statistics values (such as a median, for example) may be used instead of a time average. For example, a period for one frame of an input signal can be used as a predetermined period for a time average, as illustrated in FIGS. 2A and 2B, yet the predetermined period is not limited thereto.

Note that when a time average, for instance, is used, a local value of second power supply voltage Vcc2 can be smaller than a local value of first power supply voltage Vcc1. Stated differently, even if the value of second power supply voltage Vcc2 is greater than the value of first power supply voltage Vcc1, it is possible that second power supply voltage Vcc2 is temporarily smaller than first power supply voltage Vcc1.

Filter circuit 13 is connected to power amplifier 11 and output terminal 110, between power amplifier 11 and output terminal 110. Filter circuit 13 transfers the first radio frequency signal.

Filter circuit 14 is connected to power amplifier 12 and output terminal 120, between power amplifier 12 and output terminal 120. Filter circuit 14 transfers the second radio frequency signal.

Output terminal 110 is an example of a first output terminal, and is connected to antenna 21. The first radio frequency signal amplified by power amplifier 11 is output through output terminal 110 to antenna 21.

Output terminal 120 is an example of a second output terminal, and is connected to antenna 22. The second radio frequency signal amplified by power amplifier 12 is output through output terminal 120 to antenna 22.

Note that filter circuits 13 and 14, input terminals 130 and 140, and output terminals 110 and 120 are not necessarily included in radio frequency circuit 1 according to the present embodiment.

1.2 First Power Supply Voltage Vcc1 and Second Power Supply Voltage Vcc

Here, a reason that the value of second power supply voltage Vcc2 is greater than the value of first power supply voltage Vcc1 is to be described with reference to the drawings. First, the required performance of the power amplifiers is to be described with reference to FIG. 3.

Figure 3:
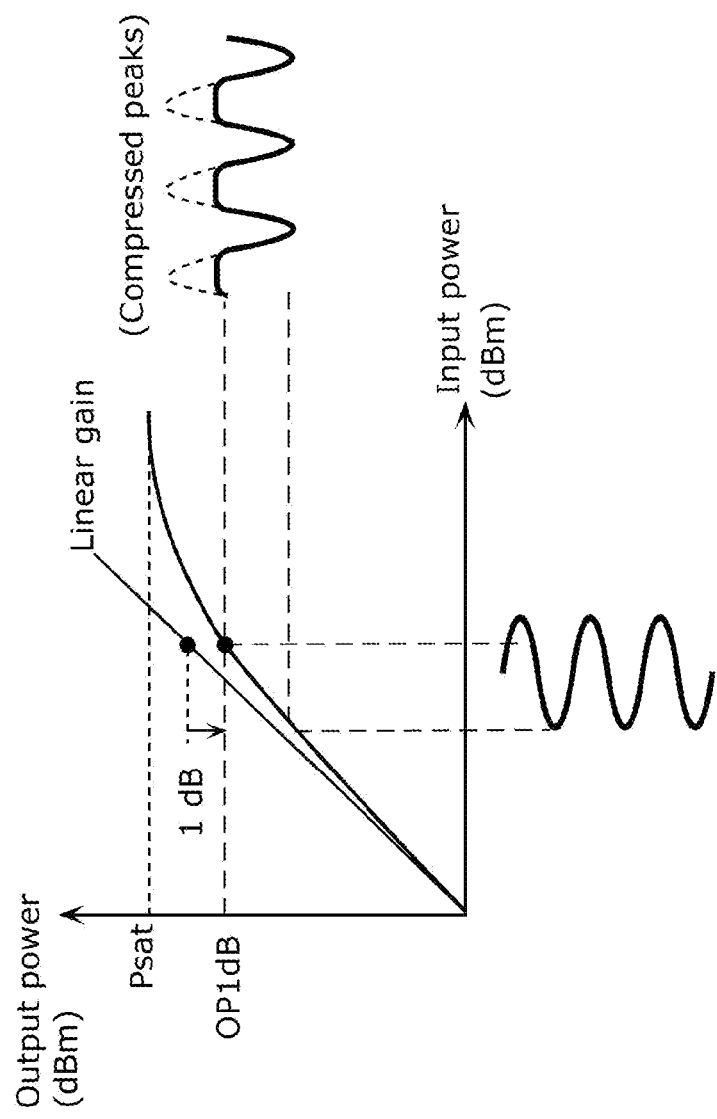
FIG. 3 illustrates a graph for describing a required performance of a power amplifier.

FIG. 3 illustrates a graph for describing a required performance of a power amplifier. In FIG. 3, the horizontal axis represents the input power to a power amplifier, and a vertical axis represents the output power from the power amplifier.

As illustrated in FIG. 3, when the input power to the amplifier is small, the output power increases in proportion to the input power. When the input power to the amplifier increases, the ratio (gain) of the output power to the input power gradually falls. Thus, if the input power to the amplifier increases, the linearity between input power and output power falls so that the nonlinearity therebetween increases. An output waveform is distorted by the nonlinearity between input power and output power.

One of the indices indicating the performance of an amplifier regarding the linearity is a 1-dB compression point (OP1 dB). OP1 dB indicates the output power at a point where the gain of an amplifier is lower by 1 dB than the linear gain. Thus, OP1 dB defines the upper limit of output power at which the linearity between the input power and the output power can be maintained so that the nonlinearity is low.

When the amplitude of an input signal is modulated, even if the output power in response to the average power of an input signal is less than or equal to OP1 dB, output power in response to the peak power of an input signal may exceed OP1 dB. In such a case, the peaks of an output signal are compressed as illustrated in FIG. 3, resulting in a distortion in an output waveform. Accordingly, the higher the peaks of an input signal are, the more readily an output waveform is distorted, and thus the input power to an amplifier needs to be limited to lower power.

One of the indices indicating the height of a peak of a signal is a peak-to-average power ratio (PAPR). A PAPR indicates the ratio of a peak value to an effective value, and specifically, is a value obtained by dividing the square of a peak amplitude of a waveform by the square of a root-mean-square (RMS) value of a waveform. It is indicated that the higher the PAPR is, the higher the peak of a signal is. It is known that a PAPR depends on a modulation method.

Figure 4:
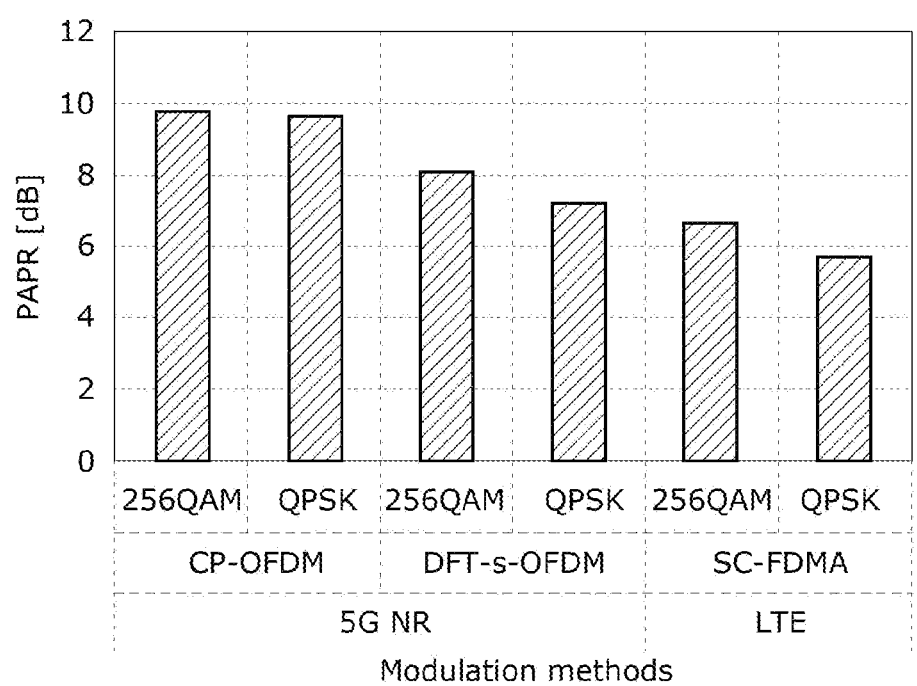
FIG. 4 illustrates a graph showing a relation between the peak-to-average power ratio (PAPR) and the primary and secondary modulation methods.

FIG. 4 illustrates a graph showing a relation between the PAPRs and primary and secondary modulation methods. In FIG. 4, the horizontal axis represents the modulation methods and the vertical axis represents a PAPR. Examples of the primary modulation methods include phase-shift keying (PSK), amplitude-shift keying (ASK), frequency-shift keying (FSK), and quadrature amplitude modulation (QAM), for instance. In FIG. 4, quadrature phase-shift keying (QPSK) and 256QAM are shown as examples of the primary modulation methods.

As illustrated in FIG. 4, the PAPR depends more greatly on the secondary modulation methods, and increases in the order of SC-FDMA, DFT-s-OFDM, and CP-OFDM. Accordingly, the PAPR of a 5G NR signal is greater than the PAPR of an LTE signal. Accordingly, the output waveform of a 5G NR signal from an amplifier is more readily distorted than an LTE signal, so that the quality of the 5G NR signal deteriorates.

Figure 5A:
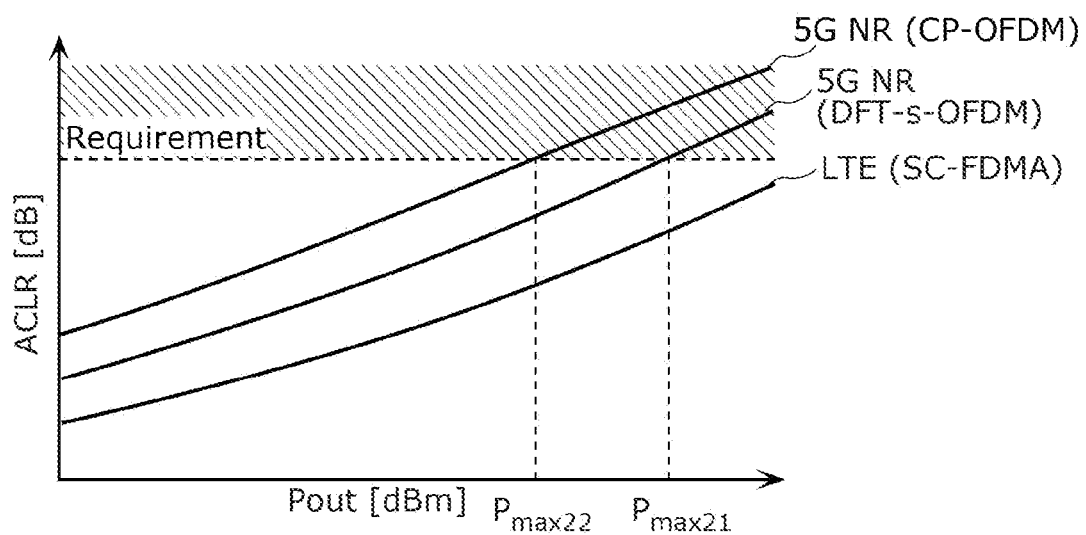
FIG. 5A illustrates a graph showing an example of a relation between the output power from an amplifier and the signal quality.
Figure 5B:
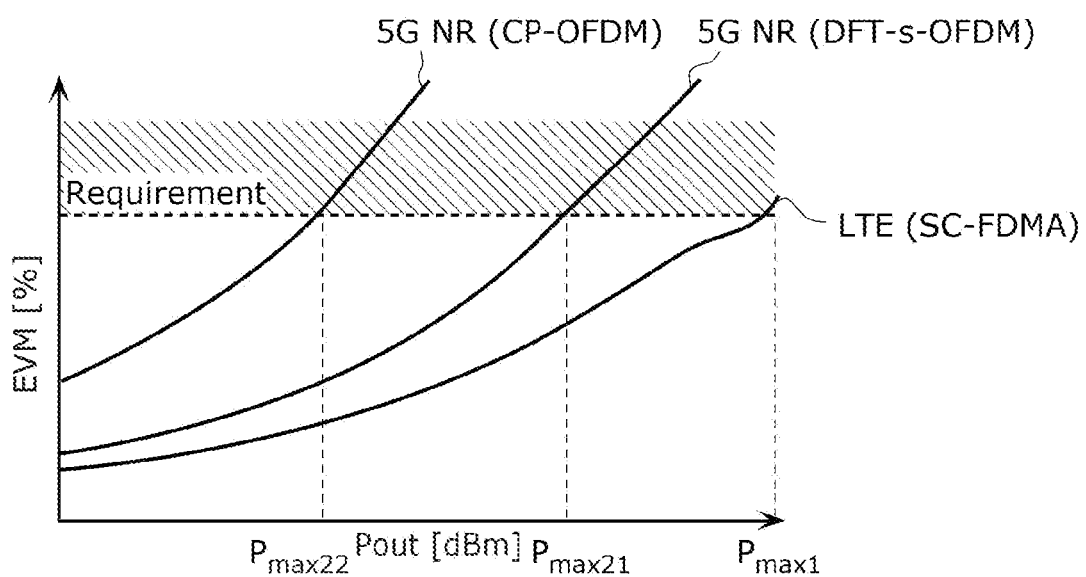
FIG. 5B illustrates a graph showing an example of a relation between the output power from an amplifier and the signal quality.

FIGS. 5A and 5B each illustrate a graph showing an example of a relation between output powers from an amplifier and signal qualities In FIGS. 5A and 5B, their horizontal axes represent output powers (average) from an amplifier, and the vertical axes represent qualities of output signals. The cross-hatched region shows a region where the quality requirement is not satisfied. In FIGS. 5A and 5B, a signal used has the center frequency of LTE Band 8 or 5G NR n8, and a channel bandwidth of 10 MHz.

As an index that indicates the quality of a signal, an adjacent channel leakage ratio (ACLR) is used in FIG. 5A, and an error vector magnitude (EVM) is used in FIG. 5B.

The ACLR indicates a ratio of total power (intermodulation signals) of adjacent channels to power of a main channel (a useful signal). The higher the ACLR is, the lower the quality of a signal is. The EVM indicates how far a constellation point of a signal is distant from a constellation point of an ideal signal. The greater the EVM is, the lower the quality of a signal is.

As illustrated in FIGS. 5A and 5B, if the output power of the signals increases, the qualities of the signals deteriorate. $P_{max1}$ is greater than $P_{max21}$, and $P_{max21}$ is greater than $P_{max22}$.

Here, $P_{max1}$ indicates the upper limit of the output power for an LTE (SC-FDMA) signal to satisfy the quality requirement. $P_{max21}$ indicates the upper limit of the output power for a 5G NR (DFT-s-OFDM) signal to satisfy the quality requirement. $P_{max22}$ indicates the upper limit of the output power for a 5G NR (CP-OFDM) signal to satisfy the quality requirement.

Accordingly, in order to satisfy the quality requirement, the output power of a 5G NR signal is more strictly limited than the output power of an LTE signal. This is because the PAPR of a 5G NR signal is higher than the PAPR of an LTE signal, as described with reference to FIGS. 3 and 4, and thus the output waveform of an amplifier is more distorted. Accordingly, in order to make the limit of the output power of a 5G NR signal less strict, it is necessary to improve performance (OP1 dB) of an amplifier more than when an LTE signal is amplified.

In view of this, in the present embodiment, the value of second power supply voltage Vcc2 applied to power amplifier 12 for a 5G NR signal is made greater than the value of first power supply voltage Vcc1 applied to power amplifier 11 for an LTE signal.

Figure 6:
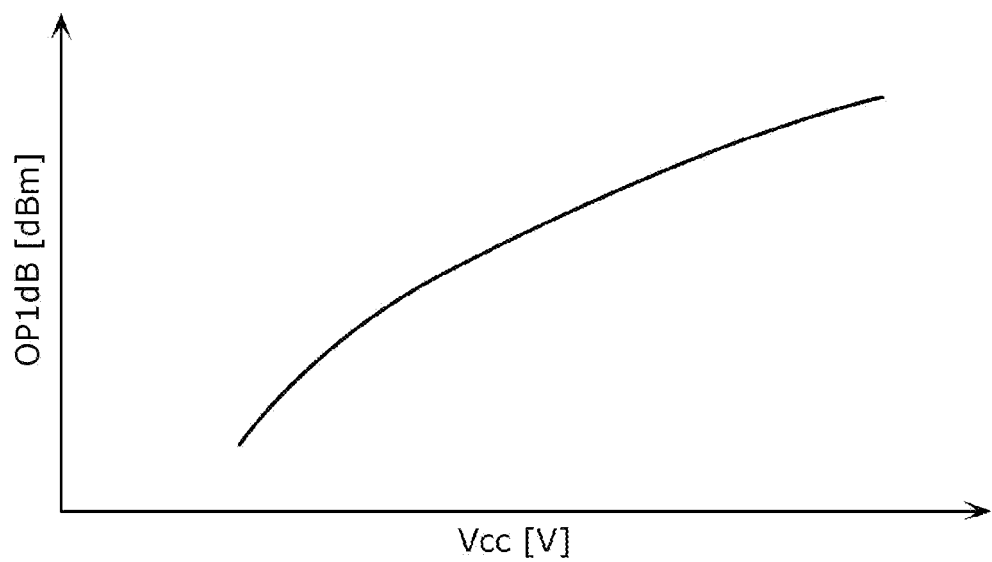
FIG. 6 illustrates a graph showing an example of a relation between the power supply voltage and the 1-dB compression points (OP1 dB).

FIG. 6 illustrates a graph showing an example of a relation between the power supply voltage and the OP1 dB. In FIG. 6, the horizontal axis represents the power supply voltage, and the vertical axis represents the OP1 dB. As illustrated in FIG. 6, the OP1 dB of a power amplifier increases with an increase in the power supply voltage (see FIG. 6). Accordingly, the limit of the output power from power amplifier 12 can be made less strict by making the value of second power supply voltage Vcc2 greater than the value of first power supply voltage Vcc1.

Figure 7A:
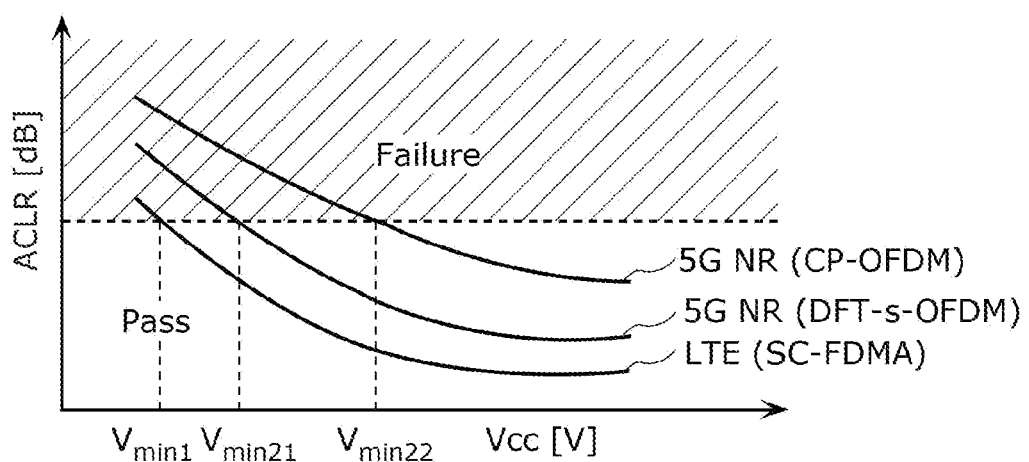
FIG. 7A illustrates a graph showing an example of a relation between the power supply voltage applied to an amplifier and the signal quality when output power is the same.
Figure 7B:
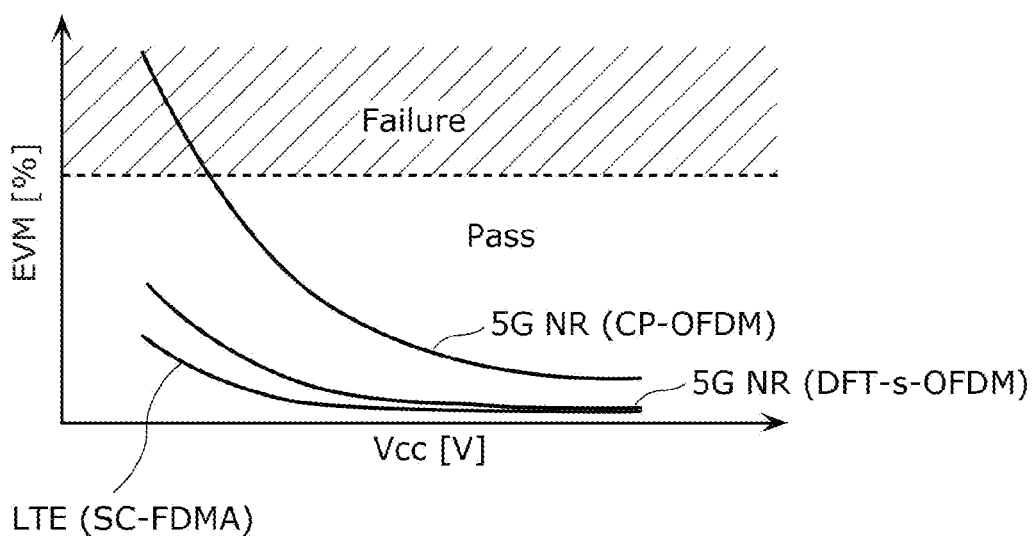
FIG. 7B illustrates a graph showing an example of a relation between the power supply voltage applied to an amplifier and the signal quality when output power is the same.
Figure 8A:
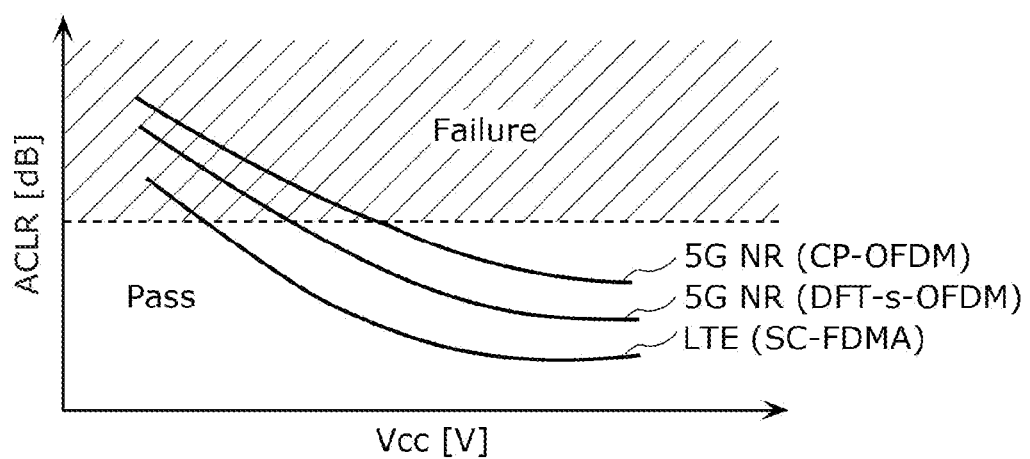
FIG. 8A illustrates a graph showing an example of a relation between the power supply voltage applied to an amplifier and the signal quality when output power is the same.
Figure 8B:
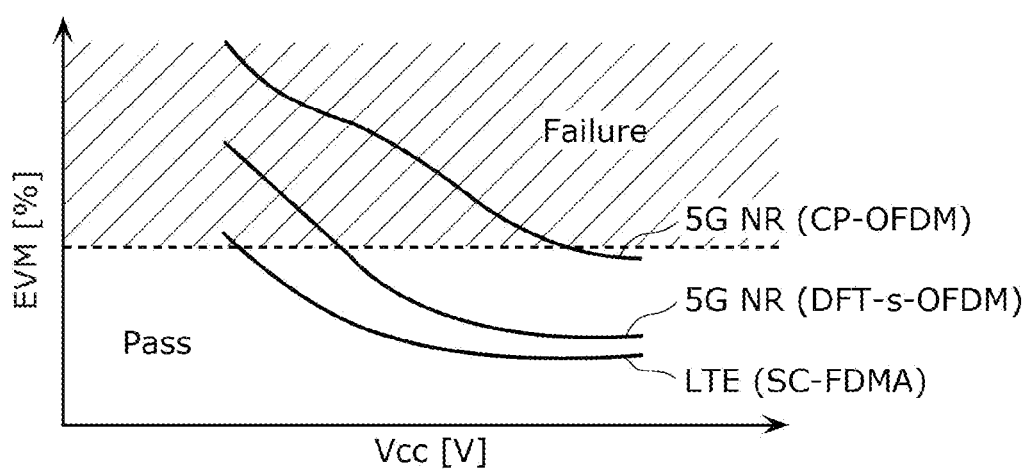
FIG. 8B illustrates a graph showing an example of a relation between the power supply voltage applied to an amplifier and the signal quality when output power is the same.

FIGS. 7A-7B and 8A-8B each illustrate a graph showing an example of a relation between a power supply voltage applied to an amplifier and signal quality when output power is the same (23 dBm). In FIGS. 7A-7B and 8A-8B, the horizontal axis represents power supply voltage Vcc, and shows the quality of an output signal. The cross-hatched region shows a region where the quality requirement is not satisfied. In FIGS. 7A and 8B, a signal used has a center frequency of LTE Band 8 or 5G NR n8, and a channel bandwidth of 10 MHz.

Note that in FIGS. 7A and 7B, QPSK is used as the primary modulation method for an input signal to an amplifier, and in FIGS. 8A and 8B, 256QAM is used as the primary modulation method for an input signal to an amplifier.

As illustrated in FIGS. 7A to 8B, the signal quality improves if power supply voltage increases, which applies to any type of the primary and secondary modulation methods. The power supply voltage for satisfying the quality requirement differs depending on the type of the secondary modulation methods. For example, in FIG. 7A, it can be seen that a power supply voltage higher than $V_{min1}$ may be used as a power supply voltage for an LTE (SC-FDMA) signal. Furthermore, it can be seen that a power supply voltage higher than $V_{min21}$ may be used as a power supply voltage for a 5G NR (DFT-s-OFDM) signal. Furthermore, it can be seen that a power supply voltage higher than $V_{min22}$ may be used as a power supply voltage for a 5G NR (CP-OFDM) signal. At this time, $V_{min21}$ and $V_{min22}$ are each greater than $V_{min1}$.

Accordingly, as can be seen from FIGS. 7A-7B and 8A-8B, by making the value of second power supply voltage Vcc2 applied to power amplifier 12 for a 5G NR signal greater than the value of first power supply voltage Vcc1 applied to power amplifier 11 for an LTE signal, the quality requirement can be satisfied while maintaining the transmission power level (Power Class 3 (23 dBm)) for a 5G NR signal.

Figure 9:
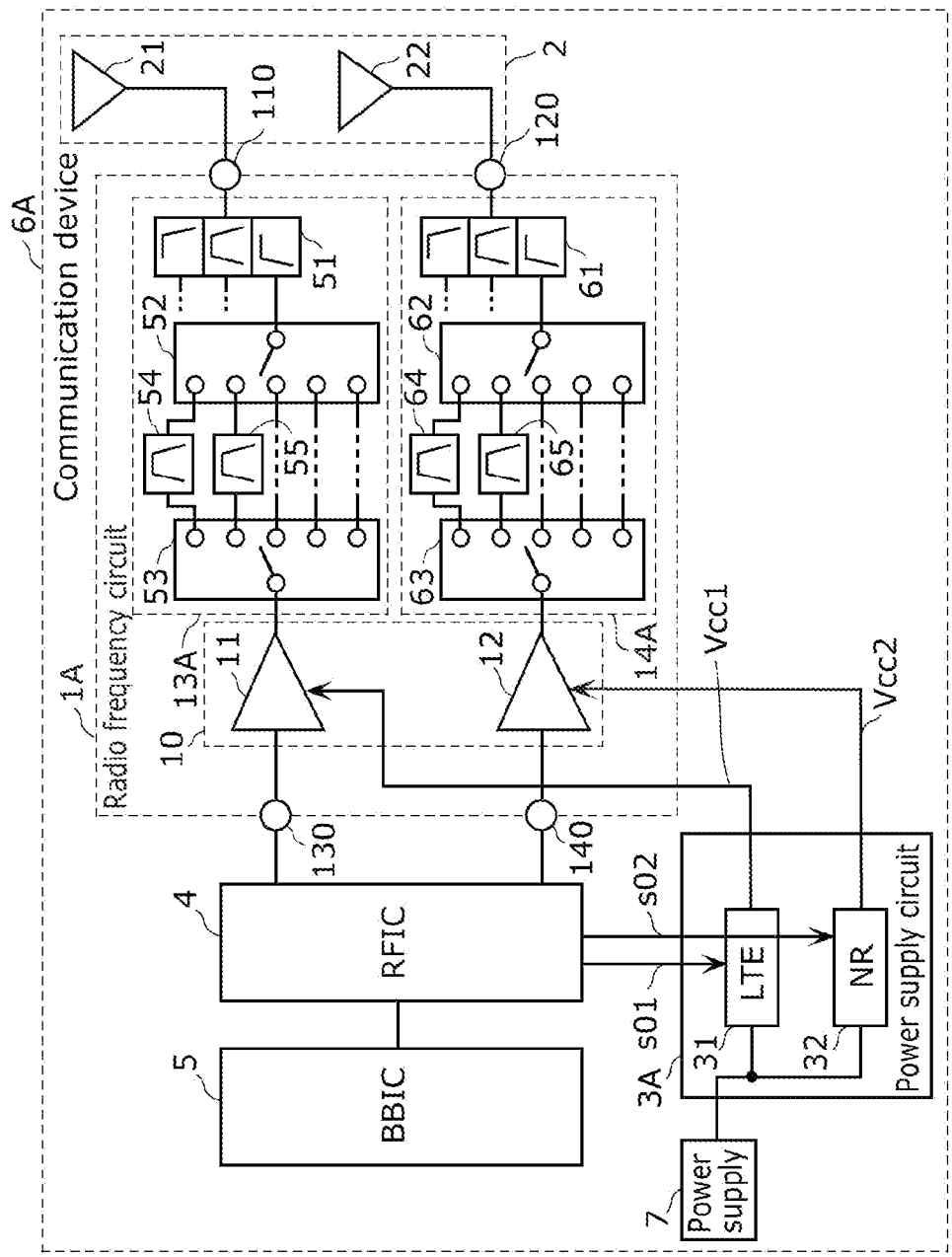
FIG. 9 illustrates a circuit configuration of a radio frequency circuit and a communication device according to an example.

1.3 Configuration of Radio Frequency Circuit and Communication Device According to Example FIG. 9 illustrates a circuit configuration of radio frequency circuit 1A and communication device 6A according to another example of the present disclosure. The circuit configuration of radio frequency circuit 1A and communication device 6A illustrated in FIG. 9 is a specific example of the circuit configuration of radio frequency circuit 1 and communication device 6 according to Embodiment 1. In the following, the description of the configuration of radio frequency circuit 1A and communication device 6A according to this example which is the same as the configuration of radio frequency circuit 1 and communication device 6 according to Embodiment 1 is omitted, and the configuration of radio frequency circuit 1A and communication device 6A different therefrom is mainly described.

As illustrated in FIG. 9, communication device 6A includes radio frequency circuit 1A, antenna circuit 2, power supply circuit 3A, RFIC 4, BBIC 5, and power supply 7.

Radio frequency circuit 1A includes input terminals 130 and 140, output terminals 110 and 120, amplifier circuit 10, and filter circuits 13A and 14A.

In this example, power amplifier 11 and filter circuit 13A transfer LTE signals. Power amplifier 12 and filter circuit 14A transfer 5G NR signals.

Filter circuit 13A is connected between power amplifier 11 and output terminal 110, and passes LTE signals in a plurality of communication bands. Filter circuit 13A includes multiplexer 51, switches 52 and 53, and filters 54 and 55. Note that one or more other filters aside from filters 54 and 55 may be disposed between switches 52 and 53.

Multiplexer 51 includes a low-pass filter, a band-pass filter, and a high-pass filter, for example. The low-pass filter has a passband that includes a frequency band belonging to a low band group out of LTE bands (LTE frequency bands), for example. The band-pass filter has a passband that includes a frequency band belonging to a middle band group out of the LTE bands, for example. The high-pass filter has a passband that includes a frequency band belonging to a high band group out of the LTE bands, for example.

Filter 54 is a band-pass filter having a passband that includes LTE band B41 (the band: 2496 MHz to 2690 MHz), for example. Filter 55 is a band-pass filter having a passband that includes LTE band B40 (the band: 2300 MHz to 2400 MHz) or LTE band B30 (the transmission band: 2305 MHz to 2315 MHz), for example.

Switch 52 is connected between multiplexer 51 and filters 54 and 55, and switch 53 is connected between power amplifier 11 and filters 54 and 55. Switch 52 connects a filter out of filters 54 and 55 and other filters to multiplexer 51, based on a control signal from RFIC 4. Switch 53 connects a filter out of filters 54 and 55 and other filters to power amplifier 11, based on a control signal from RFIC 4.

Filter circuit 14A is connected between power amplifier 12 and output terminal 120, and passes 5G NR signals in a plurality of communication bands. Filter circuit 14A includes multiplexer 61, switches 62 and 63, and filters 64 and 65. Note that not only filters 64 and 65 but also one or more other filters may be disposed between switches 62 and 63.

Multiplexer 61 includes a low-pass filter, a band-pass filter, and a high-pass filter, for example. The low-pass filter has a passband that includes a frequency band belonging to a low band group (for example, 663 MHz to 960 MHz) out of the 5G NR bands (5G NR frequency bands), for example. The band-pass filter has a passband that includes a frequency band belonging to a middle band group (for example, 1427 MHz to 2690 MHz) out of the 5G NR bands, for example. The high-pass filter has a passband that includes a frequency band belonging to a high band group (for example, 3300 MHz to 5000 MHz) out of the 5G NR bands, for example.

Filter 64 is a band-pass filter having a passband that includes 5G NR band n41 (the band: 2496 MHz to 2690 MHz), for example. Filter 65 is a band-pass filter having a passband that includes 5G NR band n40 (the band: 2300 MHz to 2400 MHz), for example.

Switch 62 is connected between multiplexer 61 and filters 64 and 65, and switch 63 is connected between power amplifier 12 and filters 64 and 65. Switch 62 connects a filter out of filters 64 and 65 and other filters to multiplexer 61, based on a control signal from RFIC 4. Switch 63 connects a filter out of filters 64 and 65 and other filters to power amplifier 12, based on a control signal from RFIC 4.

Power supply circuit 3A includes power supply circuit 31 for LTE, and power supply circuit 32 for 5G NR.

Power supply circuit 31 is connected to power supply 7. Power supply circuit 31 applies first power supply voltage Vcc1 to power amplifier 11, based on control signal s01 output by RFIC 4.

Power supply circuit 32 is connected to power supply 7. Power supply circuit 32 applies second power supply voltage Vcc2 different from first power supply voltage Vcc1 to power amplifier 12, based on control signal s02 output by RFIC 4. At this time, the value of second power supply voltage Vcc2 is greater than the value of first power supply voltage Vcc1.

Power supply 7 supplies, to power supply circuit 3A, power for power supply circuit 3A to generate a power supply voltage applied to amplifier circuit 10. Note that power supply 7 and power supply circuit 3A are not necessarily included in communication device 6A. In this case, a power supply voltage may be supplied from the outside to communication device 6A.

Note that radio frequency circuit 1A transfers a 5G NR signal as the second radio frequency signal in this example, yet radio frequency circuit 1A may transfer a WLAN signal instead of or in addition to a 5G NR signal.

1.4 First Predetermined Condition Regarding First Radio Frequency Signal and Second Radio Frequency Signal Next, the first predetermined condition regarding the first radio frequency signal and the second radio frequency signal is to be described. Here, the case where the first radio frequency signal is a signal in the first band for LTE, and the second radio frequency signal is a signal in the second band for 5G NR is to be described.

Table 1 shows a relation of first power supply voltage Vcc1 applied to power amplifier 11 to the bandwidth and the channel bandwidth of the first radio frequency signal. Table 2 shows a relation of second power supply voltage Vcc2 applied to power amplifier 12 to the bandwidth and the channel bandwidth of the second radio frequency signal.

TABLE 1

| Bandwidth of first band | Channel bandwidth of first RF signal | First power supply voltage Vcc1 |
|---|---|---|
| Narrower than predetermined bandwidth | 10 MHz | ±0 |
|  | 20 MHz | +0.1 |
| Predetermined bandwidth or wider | 10 MHz | +0.2 |
|  | 20 MHz | +0.3 |

TABLE 2

| Bandwidth of second band | Channel bandwidth of second RF signal | Second power supply voltage Vcc2 |
|---|---|---|
| Narrower than predetermined bandwidth | 10 MHz | +0.2 |
|  | 20 MHz | +0.3 |
| Predetermined bandwidth or wider | 10 MHz | +0.5 |
|  | 20 MHz | +0.6 |

In Table 1 and 2, first power supply voltage Vcc1 and second power supply voltage Vcc2 are shown in relative voltages with respect to a reference voltage. For example, 3 V can be used as a reference voltage, yet the reference voltage is not limited thereto.

A predetermined bandwidth is experientially and/or experimentally determined in advance, in order to classify bandwidths. 30 MHz can be used as the predetermined bandwidth, for example, yet the predetermined bandwidth is not limited thereto.

Tables 1 and 2 show that the value of second power supply voltage Vcc2 is greater than the value of first power supply voltage Vcc2 if any of the following conditions is satisfied.

(i) Both the bandwidth of the first band and the bandwidth of the second band are narrower than the predetermined bandwidth or are the predetermined bandwidth or wider.

(ii) The bandwidth of the first band is narrower than the predetermined bandwidth, and the bandwidth of the second band is the predetermined bandwidth or wider.

(iii) The bandwidth of the first band is the predetermined bandwidth or wider, the bandwidth of the second band is narrower than the predetermined bandwidth, and the channel bandwidth of the first radio frequency signal is narrower than the channel bandwidth of the second radio frequency signal.

Accordingly, any of conditions (i) to (iii) above can be used as the first predetermined condition regarding the first radio frequency signal and the second radio frequency signal. [too] Note that Table 3 below shows the conceivable examples of combinations of the first radio frequency signal and the second radio frequency signal that satisfy conditions (i) to (iii) above.

TABLE 3

| First radio frequency signal | | Second radio frequency signal | |
|---|---|---|---|
| Band | Channel bandwidth | Band | Channel bandwidth |
| Band 3 | 10 MHz | n3 | 10 MHz |
| Band 3 | 20 MHz | n3 | 20 MHz |
| Band 20 | 10 MHz | n8 | 10 MHz |
| Band 20 | 20 MHz | n8 | 20 MHz |
| Band 8 | 20 MHz | n78 | 40 MHz |
| Band 20 | 10 MHz | n78 | 40 MHz |
| Band 41 | 20 MHz | NR-U | 20 MHz |

Note that the combinations of the first radio frequency signal and the second radio frequency signal in Table 3 allow simultaneous transfer of the first radio frequency signal and the second radio frequency signal.

As described above, radio frequency circuit 1 according to the present embodiment and radio frequency circuit 1A according to an example thereof each include: amplifier circuit 10 configured to amplify a first radio frequency signal using first power supply voltage Vcc1, and amplify a second radio frequency signal using second power supply voltage Vcc2. The first radio frequency signal is a signal in a first band for Long Term Evolution (LTE), the second radio frequency signal is a signal in a second band for 5th Generation New Radio (5G NR) or a wireless local area network (WLAN) signal, and in a state in which a first predetermined condition regarding the first radio frequency signal and the second radio frequency signal is satisfied, a value of second power supply voltage Vcc2 is greater than a value of first power supply voltage Vcc1.

Communication device 6 according to the present embodiment and communication device 6A according to the example thereof each include RFIC 4 that processes a radio frequency signal, and radio frequency circuit 1 (1A) that transfers the radio frequency signal processed by RFIC 4.

According to this, when the first predetermined condition is satisfied, the value of the second power supply voltage used to amplify a 5G NR signal or a WLAN signal can be made greater than the value of the first power supply voltage used to amplify an LTE signal. The output performance (OP1 dB) of an amplifier circuit improves if a power supply voltage increases (see FIG. 6). Thus, in transmitting a 5G NR signal or a WLAN signal that normally has a higher PAPR and requires an amplifier to have higher performance than an LTE signal does, the quality requirement can be satisfied while making the limit of the transmission power level less strict (see FIGS. 4 to 5B and FIGS. 7A to 8B).

For example, in each of radio frequency circuit 1 according to the present embodiment and radio frequency circuit 1A according to an example thereof, amplifier circuit 10 may include: power amplifier 11 configured to receive the input of the first radio frequency signal and application of first power supply voltage Vcc1; and power amplifier 12 configured to receive the input of the second radio frequency signal and application of second power supply voltage Vcc2.

According to this, amplifier circuit 10 can include power amplifier 11 for the first radio frequency signal, and power amplifier 12 for the second radio frequency signal, and can simultaneously transmit the first radio frequency signal and the second radio frequency signal. Furthermore, the performance of power amplifiers 11 and 12 can be adjusted by applying different power supply voltages thereto, and thus amplifiers having the same performance can be used as power amplifiers 11 and 12.

Accordingly, a less variety of amplifiers are included in radio frequency circuits 1 and 1A, and thus the manufacturing cost of radio frequency circuits 1 and 1A can be reduced.

For example, radio frequency circuit 1 according to the present embodiment and radio frequency circuit 1A according to an example thereof may each include output terminal 110 through which the first radio frequency signal amplified by power amplifier 11 is output; and output terminal 120 through which the second radio frequency signal amplified by power amplifier 12 is output. Output terminal 110 and output terminal 120 may be connected to different antennas 21 and 22.

According to this, a transmission path for the first radio frequency signal and a transmission path for the second radio frequency signal can be separated. Accordingly, when the first radio frequency signal and the second radio frequency signal are simultaneously transmitted, interference between the two radio frequency signals can be further reduced, and qualities of the first radio frequency signal and the second radio frequency signal can be improved.

For example, in each of radio frequency circuit 1 according to the present embodiment and radio frequency circuit 1A according to an example thereof, amplifier circuit 10 may have an envelope tracking (ET) mode in which a power supply voltage is adjusted by envelope tracking, and in the ET mode, a time average of first power supply voltage Vcc1 may be used as a value of first power supply voltage Vcc1, and a time average of second power supply voltage Vcc2 may be used as a value of second power supply voltage Vcc2.

According to this, the power consumption of the amplifier circuit can be reduced using the ET mode, and furthermore the quality requirement can be satisfied while making the limit of the transmission power level less strict.

For example, in each of radio frequency circuit 1 according to the present embodiment and radio frequency circuit 1A according to an example thereof, the first radio frequency signal may be a signal modulated by single-carrier frequency-division multiplexing (SC-FDM), and the second radio frequency signal may be a signal modulated by discrete Fourier transform spread orthogonal frequency-division multiplexing (DFT-s-OFDM), cyclic prefix orthogonal frequency-division multiplexing (CP-OFDM), or orthogonal frequency-division multiplexing (OFDM).

According to this, modulation methods in conformity with the standards can be used for the first radio frequency signal and the second radio frequency signal.

Embodiment 2

Next, Embodiment 2 is to be described. The present embodiment is mainly different from Embodiment 1 described above in that both the first radio frequency signal and the second radio frequency signal are amplified by a single amplifier. The following describes the present embodiment, focusing on the differences from Embodiment 1 described above with reference to the drawings.

Figure 10:
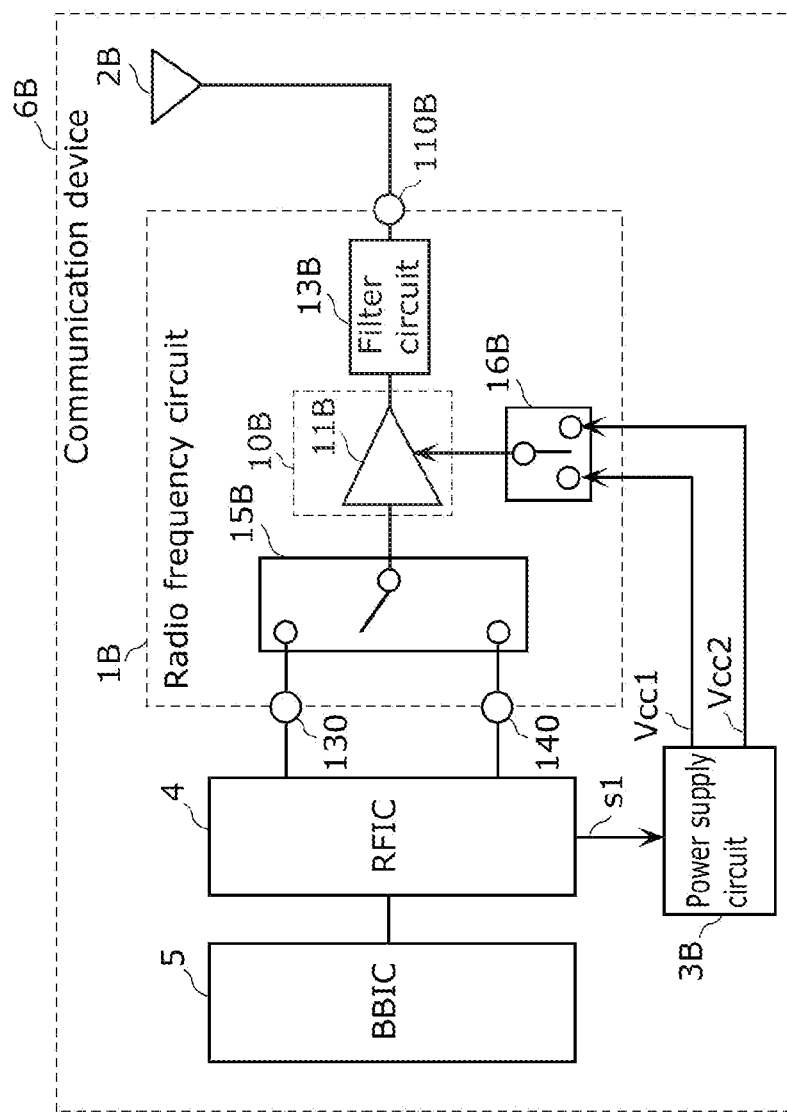
FIG. 10 illustrates a circuit configuration of a radio frequency circuit and a communication device according to Embodiment 2.

2.1 Circuit Configuration of Radio Frequency Circuit 1B and Communication Device 6B The circuit configuration of radio frequency circuit 1B and communication device 6B according to the present embodiment is to be described with reference to FIG. 10. FIG. 10 illustrates a circuit configuration of radio frequency circuit 1B and communication device 6B according to Embodiment 2.

2.1.1 Circuit Configuration of Communication Device 6B

As illustrated in FIG. 10, communication device 6B according to the present embodiment includes radio frequency circuit 1B, antenna 2B, power supply circuit 3B, RFIC 4, and BBIC 5.

Radio frequency circuit 1B transfers radio frequency signals between antenna 2B and RFIC 4. A detailed circuit configuration of radio frequency circuit 1B is described below.

Antenna 2B is connected to output terminal 110B of radio frequency circuit 1B, and transmits the first radio frequency signal and the second radio frequency signal.

Power supply circuit 3B applies first power supply voltage Vcc1 or second power supply voltage Vcc2 to amplifier circuit 10B, based on control signal s1 from RFIC 4.

Note that antenna 2B, power supply circuit 3B, and BBIC 5 are not necessarily included in communication device 6B according to the present embodiment.

2.1.2 Circuit Configuration of Radio Frequency Circuit 110B

As illustrated in FIG. 10, radio frequency circuit 1B includes amplifier circuit 10B, filter circuit 13B, switches 15B and 16B, input terminals 130 and 140, and output terminal 110B.

Amplifier circuit 10B is an example of an amplifier circuit that amplifies a first radio frequency signal using a first power supply voltage, and amplifies a second radio frequency signal using a second power supply voltage. As illustrated in FIG. 10, amplifier circuit 10B includes power amplifier 11B.

Power amplifier 11B is an example of a third amplifier. The input received by power amplifier 11B is switched among a plurality of radio frequency signals including the first radio frequency signal and the second radio frequency signal. Specifically, power amplifier 11B is connected between switch 15B and filter circuit 13B. An LTE signal input through input terminal 130 and a 5G NR signal or a WLAN signal input through input terminal 140 are selectively input to power amplifier 11B via switch 15B. A signal input to power amplifier 11B is amplified and output toward output terminal 110B via filter circuit 13B.

In the present embodiment, first power supply voltage Vcc1 is applied to power amplifier 11B when the input received by power amplifier 11B is the first radio frequency signal, and second power supply voltage Vcc2 is applied to power amplifier 11B when the input received by power amplifier 11B is the second radio frequency signal. At this time, the value of second power supply voltage Vcc2 is greater than the value of first power supply voltage Vcc1 similarly to Embodiment 1 described above.

Note that amplifier circuit 10B may have an ET mode, and the value of a power supply voltage in the ET mode is given similarly to Embodiment 1 above.

Filter circuit 13B is connected to power amplifier 11B and output terminal 110B, between power amplifier 11B and output terminal 110B. Filter circuit 13B transfers the first radio frequency signal and the second radio frequency signal.

Switch 15B is an example of a second switch, and switches the input received by power amplifier 11B between the first radio frequency signal and the second radio frequency signal. Switch 15B includes a common terminal, a first terminal, and a second terminal. The common terminal of switch 15B is connected to power amplifier 11B. The first terminal of switch 15B is connected to input terminal 130 of radio frequency circuit 1B. The second terminal of switch 15B is connected to input terminal 140 of radio frequency circuit 1B.

With such a connecting configuration, switch 15B connects one of the first terminal and the second terminal to the common terminal. Accordingly, the input received by the third amplifier is switched between the first radio frequency signal and the second radio frequency signal. Switch 15B includes a single pole double throw (SPDT) switch circuit, for example.

Switch 16B is an example of a first switch, and switches a power supply voltage applied to power amplifier 11B between first power supply voltage Vcc1 and second power supply voltage Vcc2. Switch 16B includes a common terminal, a first terminal, and a second terminal. The common terminal of switch 16B is connected to power amplifier 11B. The first terminal of switch 16B is connected to the Vcc1 line extending from power supply circuit 3B. The second terminal of switch 16B is connected to the Vcc2 line extending from power supply circuit 3B.

With such a connecting configuration, switch 16B connects one of the first terminal and the second terminal to the common terminal. Accordingly, a power supply voltage applied to power amplifier 11B is switched between first power supply voltage Vcc1 and second power supply voltage Vcc2. Switch 16B includes an SPDT switch circuit, for example.

In switches 15B and 16B, based on, for example, a control signal from RFIC 4, the first terminals and the common terminals are synchronously connected, and the second terminals and the common terminals are synchronously connected. Accordingly, switches 15B and 16B synchronize the input of the first radio frequency signal and the supply of the first power supply voltage, and synchronize the input of the second radio frequency signal and the supply of the second power supply voltage.

Note that filter circuit 13B, input terminals 130 and 140, and output terminal 110B are not necessarily included in radio frequency circuit 1B according to the present embodiment.

As described above, in radio frequency circuit 1B according to the present embodiment, amplifier circuit 10B includes power amplifier 11B configured to receive an input of a signal switched among a plurality of radio frequency signals including the first radio frequency signal and the second radio frequency signal. In a state in which the input received by power amplifier 11B is the first radio frequency signal, first power supply voltage Vcc1 is applied to power amplifier 11B, and in a state in which the input received by power amplifier 11B is the second radio frequency signal, second power supply voltage Vcc2 is applied to power amplifier 11B.

According to this configuration, power supply voltages suitable for the first radio frequency signal and the second radio frequency signal can be applied to power amplifier 11B that receives an input of a signal switched among a plurality of radio frequency signals including the first radio frequency signal and the second radio frequency signal. Accordingly, the quality requirement for the first radio frequency signal and the second radio frequency signal can be satisfied using single power amplifier 11B, while making the limit of the transmission power level for the second radio frequency signal less strict, and thus the number of components can be reduced.

For example, radio frequency circuit 1B according to the present embodiment may further include: switch 16B configured to switch a power supply voltage applied to power amplifier 11B between first power supply voltage Vcc1 and second power supply voltage Vcc2.

According to this, in radio frequency circuit 1B, a power supply voltage applied to power amplifier 11B can be switched to another power supply voltage.

For example, radio frequency circuit 1B according to the present embodiment may further include: switch 15B configured to switch the input received by power amplifier 11B between the first radio frequency signal and the second radio frequency signal. Switch 16B and switch 15B may be configured to: synchronize the input of the first radio frequency signal and the application of first power supply voltage Vcc1; and synchronize the input of the second radio frequency signal and the application of second power supply voltage Vcc2.

According to this configuration, radio frequency circuit 1B can synchronize switching between input of signals received by power amplifier 11B and switching between power supply voltages applied thereto.

Other Embodiments

The radio frequency circuit and the communication device according to the present disclosure have been described above based on the embodiments, but are not limited to the above embodiments. The present disclosure also encompasses other embodiments achieved by combining arbitrary elements in the embodiments, and variations as a result of applying various modifications that may be conceived by those skilled in the art to the embodiments without departing from the scope of the present disclosure, and various apparatuses that include the radio frequency circuit and the communication device described above.

For example, in the radio frequency circuits and the communication devices according to the above embodiments, another circuit element and another line, for instance, may be disposed between circuit elements and paths connecting signal paths illustrated in the drawings. For example, in the above embodiments, an impedance matching circuit may be interposed between an amplifier circuit and a filter circuit.

Note that in each of the above embodiments, the radio frequency circuit does not include a reception circuit, yet the present disclosure is not limited thereto. For example, the radio frequency circuit may include a reception circuit in addition to the transmission circuit.

Note that a detailed configuration of the power amplifiers is not described in particular in the above embodiments, yet the configuration of the power amplifiers is not limited in particular. The power amplifiers may each include cascaded amplifiers and/or a differential amplifier, for example. When a power amplifier includes cascaded amplifiers, the first power supply voltage and the second power supply voltage in the above embodiments may be applied to at least one of the cascaded amplifiers. A variable power supply voltage may be applied to at least one of the cascaded amplifiers.

Note that antenna circuit 2 includes two antennas 21 and 22 in Embodiment 1 above, yet the present disclosure is not limited thereto. For example, antenna circuit 2 may include only one antenna. In this case, radio frequency circuit 1 may include a single output terminal, and may include a multiplexer or a switch connected between the single output terminal and two filter circuits 13 and 14.

Note that amplifier circuit 10B includes single power amplifier 11B in Embodiment 2 above, yet the present disclosure is not limited thereto. Amplifier circuit 10B may include a plurality of power amplifiers having performance equivalent to that of power amplifier 11B. In this case, similarly to power amplifier 11B, an input of a plurality of radio frequency signals including the first radio frequency signal and the second radio frequency signal may be switched for each of the plurality of power amplifiers. Communication device 6B may further include a plurality of antennas individually connected to the plurality of power amplifiers.

Note that antenna circuit 2 of communication device 6 includes two antennas 21 and 22 in Embodiment 1 above, yet the present disclosure is not limited thereto. For example, antenna circuit 2 may include only one of two antennas 21 and 22. In this case, radio frequency circuit 1 may include only one of output terminals 110 and 120, and both of two filter circuits 13 and 14 may be connected to the one of output terminals 110 and 120.

Note that communication device 6B includes one antenna 2B in Embodiment 2 above, yet the present disclosure is not limited thereto. For example, communication device 6B may include antenna circuit 2 that includes two antennas 21 and 22, instead of antenna 2B. In this case, the communication device may include a switch that switches the connection destination of radio frequency circuit 1 between two antennas 21 and 22.

Note that in each of the above embodiments, different power supply voltages are used to amplify two radio frequency signals, yet different power supply voltages may be used to amplify three or more radio frequency signals. In this case, the amplifier circuit may amplify the first radio frequency signal in the first band for LTE using first power supply voltage Vcc1, may amplify the second radio frequency signal in the second band for 5G NR using second power supply voltage Vcc2, and may amplify a third radio frequency signal in a third band for 5G NR using third power supply voltage Vcc3. At this time, if a second predetermined condition regarding the first radio frequency signal, the second radio frequency signal, and the third radio frequency signal is satisfied, the value of second power supply voltage Vcc2 may be greater than the value of first power supply voltage Vcc1, and the value of first power supply voltage Vcc1 may be greater than third power supply voltage Vcc3. Specifically, the value of first power supply voltage Vcc1, the value of second power supply voltage Vcc2, and the value of third power supply voltage Vcc3 may satisfy Vcc3<Vcc1<Vcc2.

At this time, as the second predetermined condition, for example, a condition that the bandwidth of the first band is a predetermined bandwidth or wider, and the bandwidth of the third band is narrower than the predetermined bandwidth is used. Table 4 below shows conceivable examples of combinations of the first radio frequency signal, the second radio frequency signal, and the third radio frequency signal that satisfy the second predetermined condition as stated above.

TABLE 4

| First RF signal | | Second RF signal | | Third RF signal | |
|---|---|---|---|---|---|
| Band | Channel bandwidth | Band | Channel bandwidth | Band | Channel bandwidth |
| Band 8 | 20 MHz | n78 | 40 MHz | Band 20 | 10 MHz |

Note that the third radio frequency signal may be a signal in the third band for 5G NR rather than an LTE signal. At this time, if the second predetermined condition regarding the first radio frequency signal, the second radio frequency signal, and the third radio frequency signal is satisfied, the value of second power supply voltage Vcc2 may be greater than the value of first power supply voltage Vcc1, and the value of third power supply voltage Vcc3 may be greater than second power supply voltage Vcc2. Specifically, the value of first power supply voltage Vcc1, the value of second power supply voltage Vcc2, and the value of third power supply voltage Vcc3 may satisfy Vcc1<Vcc2<Vcc3.

At this time, as the second predetermined condition, for example, a condition that the bandwidth of the second band is narrower than the predetermined bandwidth, and the bandwidth of the third band is the predetermined bandwidth or wider is used. Table 5 below shows conceivable examples of combinations of the first radio frequency signal, the second radio frequency signal, and the third radio frequency signal that satisfy the second predetermined condition described above.

TABLE 5

| First RF signal | | Second RF signal | | Third RF signal | |
|---|---|---|---|---|---|
| Band | Channel bandwidth | Band | Channel bandwidth | Band | Channel bandwidth |
| Band 20 | 10 MHz | n28 | 20 MHz | n78 | 40 MHz |

Note that the embodiments above have described the case where the first radio frequency signal is an LTE signal, and the second radio frequency signal is a 5G NR signal or a WLAN signal, yet the first radio frequency signal and the second radio frequency signal are not limited to this.

For example, the first radio frequency signal may be a WLAN signal compliant with Institute of Electrical and Electronics Engineers (IEEE) 802.11ac, and the second radio frequency signal may be a WLAN signal compliant with IEEE 802.11ax. IEEE 802.11ac and IEEE 802.11ax may be referred to as "Wi-Fi 5" and "Wi-Fi 6", respectively, as the names of products certified by Wi-Fi Alliance that is a wireless industry organization.

In this case, as the first radio frequency signal, for example, a signal having a frequency in a range from 5.15 GHz to 5.925 GHz and modulated by multiple input multiple output orthogonal frequency-division multiplexing (MIMO-OFDM) can be used. As the second radio frequency signal, for example, a signal having a frequency in a range from 5.15 GHz to 7.125 GHz and modulated by multiuser multiple input multiple output orthogonal frequency-division multiplexing (MU-MIMO-OFDM) can be used.

Note that characteristics of MIMO-OFDM and MU-MIMO-OFDM (such as, for example, PAPR, ACLR, and EVM) are assumed to be closer to the characteristics of CP-OFDM than those of DFT-s-OFDM. Furthermore, 1024QAM is used as the primary modulation method in IEEE 802.11ax, and thus the EVM requirement for a WLAN signal compliant with IEEE 802.11ax is stricter than the EVM requirement for a WLAN signal compliant with IEEE 802.11ac.

In view of this, the value of the second power supply voltage used to amplify a WLAN signal compliant with IEEE 802.11ax is made greater than the value of the first power supply voltage used to amplify a WLAN signal compliant with IEEE 802.11ac, and thus in transmitting a WLAN signal compliant with IEEE 802.11ax which normally requires higher performance of an amplifier than a WLAN signal compliant with IEEE 802.11ac does, the quality requirement can be satisfied while making the limit of the transmission power level less strict.

For example, the first radio frequency signal may be a signal in the first band for LTE or a signal in the second band for 5G NR, and the second radio frequency signal may be a WLAN signal compliant with IEEE 802.11ax. At this time, for example, Band 41 and n77 can be used for the first band and the second band, respectively, yet the present disclosure is not limited thereto. Even in such a case, in transmitting a WLAN signal compliant with IEEE 802.11ax which normally requires higher performance of an amplifier than an LTE signal or a 5G NR signal does, the quality requirement can be satisfied while making the limit of the transmission power level less strict.

Note that the first predetermined condition and the second predetermined condition are not limited to the conditions described above. Experientially and/or experimentally predetermined conditions may be used as the first predetermined condition and the second predetermined condition.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

The present disclosure can be widely used as a communication apparatus such as a mobile phone, as a radio frequency circuit disposed in a front end portion.

The invention claimed is:

1. A radio frequency circuit, comprising:
an amplifier circuit configured to amplify a first radio frequency signal using a first power supply voltage, and amplify a second radio frequency signal using a second power supply voltage,
wherein the first radio frequency signal is a signal in a first band for Long Term Evolution (LTE),
the second radio frequency signal is a signal in a second band for 5th Generation New Radio (5G NR) or a wireless local area network (WLAN) signal, and
in a state in which a first predetermined condition regarding the first radio frequency signal and the second radio frequency signal is satisfied, a value of the second power supply voltage is greater than a value of the first power supply voltage,
wherein the amplifier circuit includes a third amplifier configured to receive an input of a signal switched among a plurality of radio frequency signals including the first radio frequency signal and the second radio frequency signal, and
in a state in which the input received by the third amplifier is the first radio frequency signal, the first power supply voltage is applied to the third amplifier, and in a state in which the input received by the third amplifier is the second radio frequency signal, the second power supply voltage is applied to the third amplifier.

2. The radio frequency circuit according to claim 1, further comprising:
a first switch configured to switch a power supply voltage applied to the third amplifier between the first power supply voltage and the second power supply voltage.

3. The radio frequency circuit according to claim 2, further comprising:
a second switch configured to switch the input received by the third amplifier between the first radio frequency signal and the second radio frequency signal,
wherein the first switch and the second switch are configured to:
synchronize the input of the first radio frequency signal and the application of the first power supply voltage; and
synchronize the input of the second radio frequency signal and the application of the second power supply voltage.

4. The radio frequency circuit according to claim 1, wherein the amplifier circuit has an envelope tracking (ET) mode in which a power supply voltage is adjusted by envelope tracking, and
in the ET mode, a time average of the first power supply voltage is used as a value of the first power supply voltage, and a time average of the second power supply voltage is used as a value of the second power supply voltage.

5. The radio frequency circuit according to claim 1, wherein the first radio frequency signal is a signal modulated by single-carrier frequency-division multiplexing (SC-FDM), and
the second radio frequency signal is a signal modulated by discrete Fourier transform spread orthogonal frequency-division multiplexing (DFT-s-OFDM), cyclic prefix orthogonal frequency-division multiplexing (CP-OFDM), or orthogonal frequency-division multiplexing (OFDM).

6. The radio frequency circuit according to claim 1, wherein the second radio frequency signal is a signal in the second band for 5G NR, and
the first predetermined condition includes that a bandwidth of the first band and a bandwidth of the second band are both (i) narrower than a predetermined bandwidth or are both (ii) the predetermined bandwidth or wider.

7. The radio frequency circuit according to claim 1, wherein the second radio frequency signal is a signal in the second band for 5G NR, and
the first predetermined condition includes that a bandwidth of the first band is narrower than a predetermined bandwidth, and a bandwidth of the second band is the predetermined bandwidth or wider.

8. The radio frequency circuit according to claim 1, wherein the second radio frequency signal is a signal in the second band for 5G NR, and
the first predetermined condition includes that a bandwidth of the first band is a predetermined bandwidth or wider, a bandwidth of the second band is narrower than the predetermined bandwidth, and a channel bandwidth of the first radio frequency signal is narrower than a channel bandwidth of the second radio frequency signal.

9. The radio frequency circuit according to claim 1, wherein the amplifier circuit is configured to amplify a third radio frequency signal using a third power supply voltage,
the second radio frequency signal is a signal in the second band for 5G NR,
the third radio frequency signal is a signal in a third band for LTE,
in a state in which a second predetermined condition regarding the first radio frequency signal, the second radio frequency signal, and the third radio frequency signal is satisfied, a value of the second power supply voltage is greater than a value of the first power supply voltage, and the value of the first power supply voltage is greater than a value of the third power supply voltage, and
the second predetermined condition includes that a bandwidth of the first band is a predetermined bandwidth or wider, and a bandwidth of the third band is narrower than the predetermined bandwidth.

10. The radio frequency circuit according to claim 1, wherein the amplifier circuit is configured to amplify a third radio frequency signal using a third power supply voltage,
the second radio frequency signal is a signal in the second band for 5G NR,
the third radio frequency signal is a signal in the third band for 5G NR,
in a state in which a second predetermined condition regarding the first radio frequency signal, the second radio frequency signal, and the third radio frequency signal is satisfied, a value of the second power supply voltage is greater than a value of the first power supply voltage, and a value of the third power supply voltage is greater than the value of the second power supply voltage, and
the second predetermined condition includes that a bandwidth of the second band is narrower than a predetermined bandwidth, and a bandwidth of the third band is the predetermined bandwidth or wider.

11. A communication device, comprising:
a signal processing circuit configured to process a radio frequency signal; and
the radio frequency circuit according to claim 1 configured to transfer the radio frequency signal processed by the signal processing circuit.

* * * * *